United States Patent [19]
Van Marcke

[11] Patent Number: 5,963,135
[45] Date of Patent: Oct. 5, 1999

[54] PROXIMITY DETECTING DEVICE

[75] Inventor: Karel Carl Van Marcke, Kruishoutem, Belgium

[73] Assignee: International Sanitary Ware Manufacturing CY, S.A., Belgium

[21] Appl. No.: 08/867,597

[22] Filed: May 30, 1997

[30] Foreign Application Priority Data

Jun. 12, 1996 [EP] European Pat. Off. ............. 96201635

[51] Int. Cl.⁶ ................................................. G08B 23/00
[52] U.S. Cl. ...................... 340/573.1; 340/541; 340/555; 315/276; 315/397; 315/408; 137/1; 250/208.4; 251/129.04
[58] Field of Search ................................ 340/573.1, 541, 340/545, 555, 902, 901; 315/408, 397, 276; 363/16; 137/1; 251/129.04; 250/208.4

[56] References Cited

U.S. PATENT DOCUMENTS

| | | | |
|---|---|---|---|
| 4,156,221 | 5/1979 | Graul | 336/59 |
| 4,472,661 | 9/1984 | Culver | 315/276 |
| 4,625,155 | 11/1986 | Dietz | 315/408 |
| 4,626,849 | 12/1986 | Sims | 340/902 |
| 4,682,628 | 7/1987 | Hill | 137/624.11 |
| 5,418,702 | 5/1995 | Marinus et al. | 363/16 |
| 5,566,702 | 10/1996 | Philipp | 137/1 |

FOREIGN PATENT DOCUMENTS

| | | | |
|---|---|---|---|
| 0423102 | 10/1990 | European Pat. Off. | ........ E03C 1/05 |
| 3303404 | 2/1983 | Germany . | |

OTHER PUBLICATIONS

European Search Report dated Nov. 14, 1996 pertaining to application No. 96–201635.8 (3 pages).

*Primary Examiner*—Benjamin C. Lee
*Attorney, Agent, or Firm*—Cahill, Sutton & Thomas P.L.C.

[57] ABSTRACT

The present invention relates to a proximity detecting device for detecting the presence of an object in a target area, comprising a low voltage power source, a circuitry for generating electrical pulses and supplying them to a light emitting diode (LED) in order to emit light pulses, and a receiver for reception of light pulses emitted from the LED and directed towards said target area, characterised in that said circuitry comprises a first circuitry containing a primary coil and switching means for connecting the primary coil for a period of time to said low voltage power source such as to accumulate a predetermined amount of magnetic energy in the primary coil, and a second circuitry containing said LED and a secondary coil magnetically coupled to said primary coil to transform the accumulated magnetic energy by mutual induction upon opening said switching means each time into one of said electrical pulses.

43 Claims, 2 Drawing Sheets

PROXIMITY DETECTING DEVICE

BACKGROUND OF THE INVENTION

1. Field of the Invention

The present invention relates to a proximity detecting device for detecting the presence of an object in a target area, comprising a low voltage power source, a circuit for generating electrical pulses and supplying them to a light emitting diode (LED) in order to emit light pulses directed to the target area, and a receiver for receiving the direct or reflected light pulses emitted from the LED towards the target area.

2. Description of Related Art

A proximity detecting device is used in particular for detecting the presence of an object, a human or a human body part and may be used to activate all kinds of different systems, such as alarm systems, automatic door opening systems, counting devices, automatic bathroom fittings, such as hand dryers, faucet devices, urinals, toilets, showers, soap dispensers, towel dispensers, wash fountains, etc. Known devices for detecting the presence of an object are either passive or active. A passive device detects the presence of an object, for example on the basis of its temperature or changes in light intensity on a passive ambient light sensor. An active device actively edits a signal, for example a light signal or an acoustic signal and detects corresponding signals which are usually reflected from an object present in the target area. The passive devices have the advantage of requiring generally a smaller amount of energy than the active devices since they do not have to emit signals. The active devices, however, have the advantage that also objects or persons which do not or almost do not move can be detected reliably, which is useful for example in the case of a person using a urinal.

Commercially available active devices generally use a 12 or 6 volt battery for delivering, through the intermediary of switching means, electrical pulses to a LED in order to emit light pulses having a duration equal to the duration of the electrical pulses.

In practice, when use is made of a 12 volt battery, a serial resistance, such as 10Ω, is provided between the LED and the battery in order to reduce the voltage applied to the LED. The drawback of such a known device is that a substantial amount of energy supplied by the battery is lost in the serial resistance (10Ω). Indeed, in case the LED has a voltage drop of 1.5 volts, it can be deduced from the Ohm's law that the current through the LED is equal to 1.05A. The energy losses in the resistance of 10Ω are then $10\Omega*(1.05A)^2=11W$ for 12 volts in continuous mode.

A further drawback of this known active detecting device is that the LED must be energized each time for about 80 μsec in order to emit light pulses having a sufficiently distant range. It is clear that the longer the pulse duration, the higher the amount of energy required for each light pulse (80 μsec*1.05A=84 μsec).

SUMMARY OF THE INVENTION

An object of the present invention is to obviate the above noted drawbacks of the prior art by providing a proximity detecting device requiring less energy to emit light pulses, but covering a similar or even greater target area, and using the same energy consumption to emit stronger light pulses to obtain a better detection.

To this end, the invention is characterized in that the circuitry includes a first circuit containing a primary coil and switching means for connecting the primary coil for a period of time to a low voltage power source to accumulate a predetermined amount of magnetic energy in the primary coil, and a second circuit containing an LED and a secondary coil magnetically coupled to the primary coil to transform the magnetic energy by mutual induction into an electrical pulse each time upon opening the switching means.

It has been found that when generating electrical pulses of a considerably shorter duration but having a higher amplitude by means of magnetically coupled primary and secondary coils, it is possible to use less energy for emitting light pulses over a predetermined target area. In other words, the LED system has surprisingly a higher efficiency when providing it with electrical pulses of a higher energy level and a shorter time, the LED itself being able to resist such higher energy levels in case of a sufficiently short duty cycle.

A further important advantage of using the magnetically coupled primary and secondary coils is that the primary coil can be loaded directly by means of a low voltage source, in particular by means of a battery, i.e. without the intermediary of a serial resistance to reduce the voltage of the power source and thus without the energy losses associated therewith.

According to a first preferred embodiment of the invention, the proportion of the number of windings of the primary coil to the number of windings of the secondary coil is at least equal to about 100. This enables generation of electrical current peaks having theoretically an amplitude of at least 100 times the amplitude of the current supplied in the first circuit. In practice, some energy losses have to be taken into account, According to a second preferred embodiment of the invention, the primary and secondary coils are wound over one another around a same core. This enables reduction of the energy losses occurring when transforming the accumulated magnetic energy into electrical pulses. Preferably, the core as a third preferred embodiment is a ferrite core. Ferrite shows adequate hysteresis properties to reduce the energy losses to a minimum and to produce very short electrical pulses.

According to a fourth preferred embodiment, the invention includes means for determining the voltage of the low voltage power source, means for determining the period of time required to accumulate the predetermined amount of magnetic energy on the basis of the voltage of the low voltage power source and timer means for closing the switching means each time for the period of time. This enables generation of electrical pulses of a constant energy level for the LED, even if the power source, in particular the battery, has lost an amount of voltage upon extended use. Consequently, less expensive batteries can be used, for example alkaline batteries instead of lithium batteries.

BRIEF DESCRIPTION OF THE DRAWINGS

More details and advantages of the invention will become clear from the following description of the invention.

DESCRIPTION OF THE PREFERRED EMBODIMENT

Figure 1:
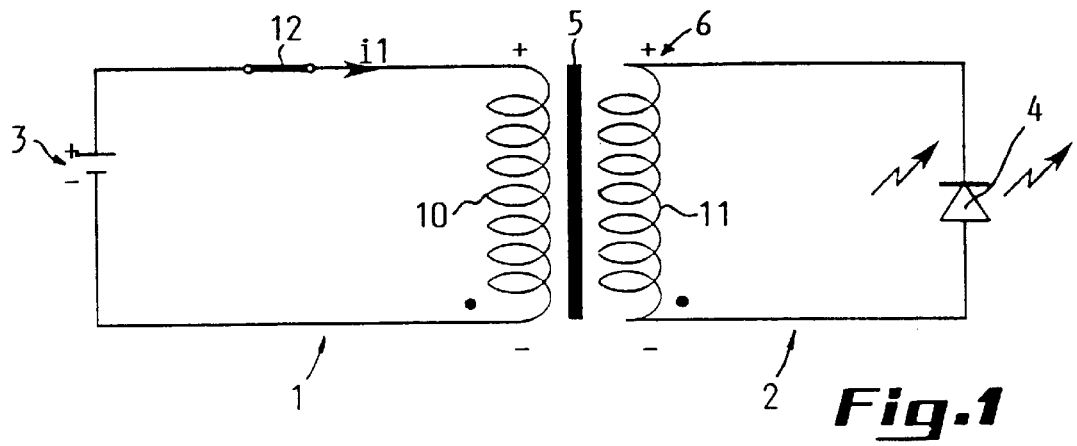
FIGS. 1 and 2 are schematics of the main components of a part of the circuitry of the invention and showing the switching means closed and open, respectively.

As illustrated in FIG. 1, the device according to the invention comprises a first circuit 1 and a second circuit 2.

First circuit 1 includes a primary coil 10 and switching means 12 for connecting the primary coil for a period of time to a power source, in particular to a battery 3, to accumulate a predetermined amount of magnetic energy in the primary coil. Second circuit 2 comprises a light emitting diode (LED) 4 and a secondary coil 11 which is magnetically coupled to primary coil 10. This can be done by disposing both coils around a same core, for example around the two legs of a closed U-shaped cores Preference is however given to locating both coils over one another around the same core 5. In this way, energy losses can be reduced to a minimum.

Figure 2:
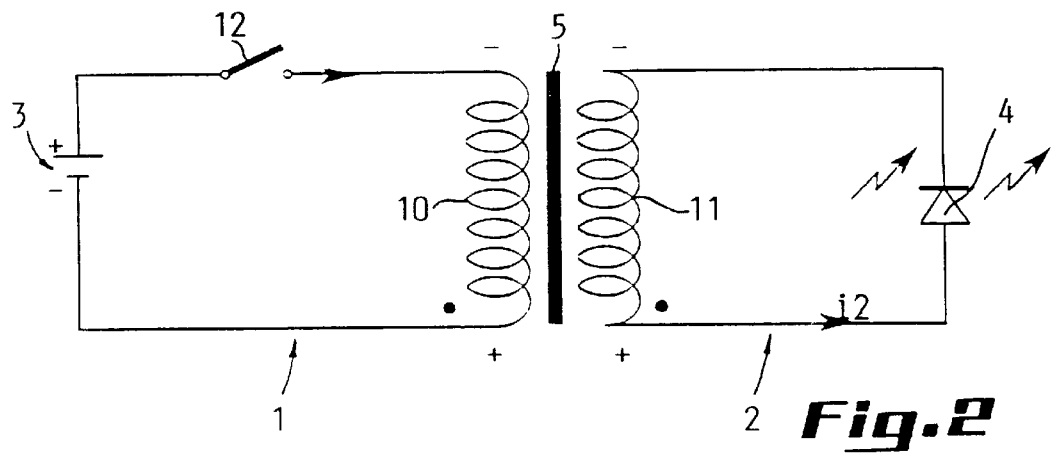

In the embodiment shown in FIGS. 1 and 2, primary and secondary coils 10 and 11 have the same winding direction, but it is clear that they may have, in the alternative, opposite winding directions. When accumulating magnetic energy in the coils by closing switching means 12 so that a current i1 flows through primary coil 10 as shown in FIG. 1, a voltage will be generated in secondary coil 11, having the polarity indicated by numeral 6, but due to the polarity of LED 4, no current can flow in the second circuit. When opening switching means 12, as shown in FIG. 2, the current i1 through primary coil 10 and thus also the magnetic field generated thereby drops suddenly to 0, as a result of which an electromotive force is generated by mutual induction in secondary coil 11. This electromotive force has the opposite polarity of the electromotive force generated when the magnetic energy was accumulated in the coils so that a current i2 can now flow through LED 4.

Upon opening switching means 12, the magnetic energy is very quickly transformed by mutual induction into an electrical pulse in second circuit 2. The number of windings n1 in primary coil 10 is higher than the number of windings n2 in secondary coil 11, which allows generation of electrical pulses having a higher current level than the electrical current supplied by power source 3 to the primary coil. Preferably, the proportion of the number of windings n1 in primary coil 10 to the number of windings n2 in secondary coil 11 is at least equal to about 100, and the primary coil has a number of windings of at least about 300. This enables transformation of the accumulated energy into a high peak current during a short period of time. In view of the allowable duty cycle of the LED for such high peak currents, the generated pulses should more particularly have a rising leading edge of a duration which is preferably shorter than 10 $\mu$sec.

Preferably, core 5 connecting the primary coil with the secondary coil is a ferrite core, since such a material shows adequate hysteresis properties which enable reduction of the energy losses to a minimum and which further enable achievement of the required short duration pulse.

A specific example of the embodiment shown in FIGS. 1 and 2 will now be given with reference to FIGS. 3 and 4.

EXAMPLE

In this example, a device with the following parameters has been chosen: a battery of 9 V, number of windings n1 in primary coil 10 equal to 707, and number of windings n2 in the secondary coil equal to 5, the core being a ferrite core.

Figure 3:
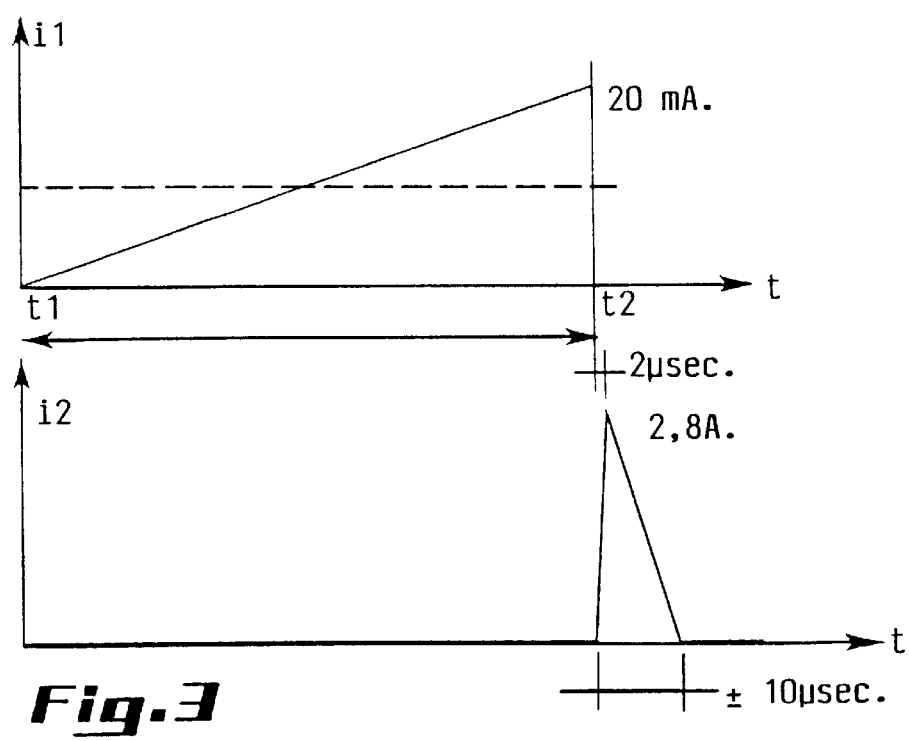
FIG. 3 illustrates the current flowing in the first and second circuits.

FIG. 3 illustrates the current flow in the first and the second circuits, respectively. Upon closing switching means 12 at the moment t1, a current i1 flows in first circuit 1 which increases linearly due to the presence of primary coil 10. Upon opening switching means 12 at the moment t2, a peak current i2, having a short duration, and more particularly, a rising leading edge of only about 2 $\mu$sec duration, flows in second circuit 2 and thus through LED 4.

In this example, the current in the first circuit was 0 mA at t1 and 20 mA at t2, while t2-t1 was equal to 366 $\mu$sec. From Lenz law, it can now be deduced that in case the energy losses are negligible, the self induction L1 in primary coil 10 is equal to:

$$\frac{9 \text{ V} * 366 * 10^{-6} \text{ s}}{20 * 10^{-3} \text{ A}} = 0.165 \text{ Henry}$$

Since both coils are wound on the same core, the induction in one winding of primary coil 10 is equal to the induction in one winding of secondary coil 11. It can therefore be deduced that:

$$\frac{L1}{L2} = \frac{n1^2}{n2^2} = k^2$$

wherein L2 is the mutual induction in the secondary coil, n1 is the number of windings in the primary coil, n2 is the number of windings in the secondary coil and k is the proportion of the number of windings in the primary coil to the number of windings in the secondary coil.

In case the energy losses upon transforming the magnetic energy into electrical energy are negligible, the amount of energy E in the first circuit is equal to the amount of energy E in the second circuit. Starting with the formulae of the amounts of energy in both circuits, the following deduction can be made:

$$E = \frac{i1_{max}^2 * L1}{2} = \frac{i2_{max}^2 * L2}{2}$$

$$i2_{max}^2 = \frac{i1_{max}^2 * L1}{L2} = \frac{i1_{max}^2 * L1}{\frac{L1}{k^2}} = i1_{max}^2 * k^2$$

$$i2_{max} = i1_{max} * k$$

wherein $i1_{max}$ is the maximum current in the first circuit and $i2_{max}$ is the maximum current in the second circuit. In this example is k equal to about 141 and $i1_{max}$ to about 20 mA so that $i2_{max}$ will be approximately equal to about 2.8A.

On the basis of the data shown in FIG. 3, the energy consumption required for emitting the light pulses can easily be calculated. Indeed, in the present example the battery is connected to the primary coil for 366 $\mu$sec, providing a current i1 having an average value of 10 mA. If the device generates one electrical pulse per second, the duty cycle δ of the device will be:

$$\delta = \frac{366 * 10^{-6} \text{ sec}}{1 \text{ sec}} = 0.000366$$

This means that the average current consumption of the battery is 3.66 $\mu$A and that the energy consumption for generating one electrical pulse per second is 10 mA*0.000366*9V*3600 s/h=118.6 mJ/h. In practice, the battery also provides current to the periphery, which is not taken into consideration herein. The prior art described above teaches that an average energy consumption when generating one pulse per second of 1.05A*0.00008*12V*3600 s/h=3.63J for 1 hour which is about 30 times more than the energy consumption of the invention.

Figure 4:
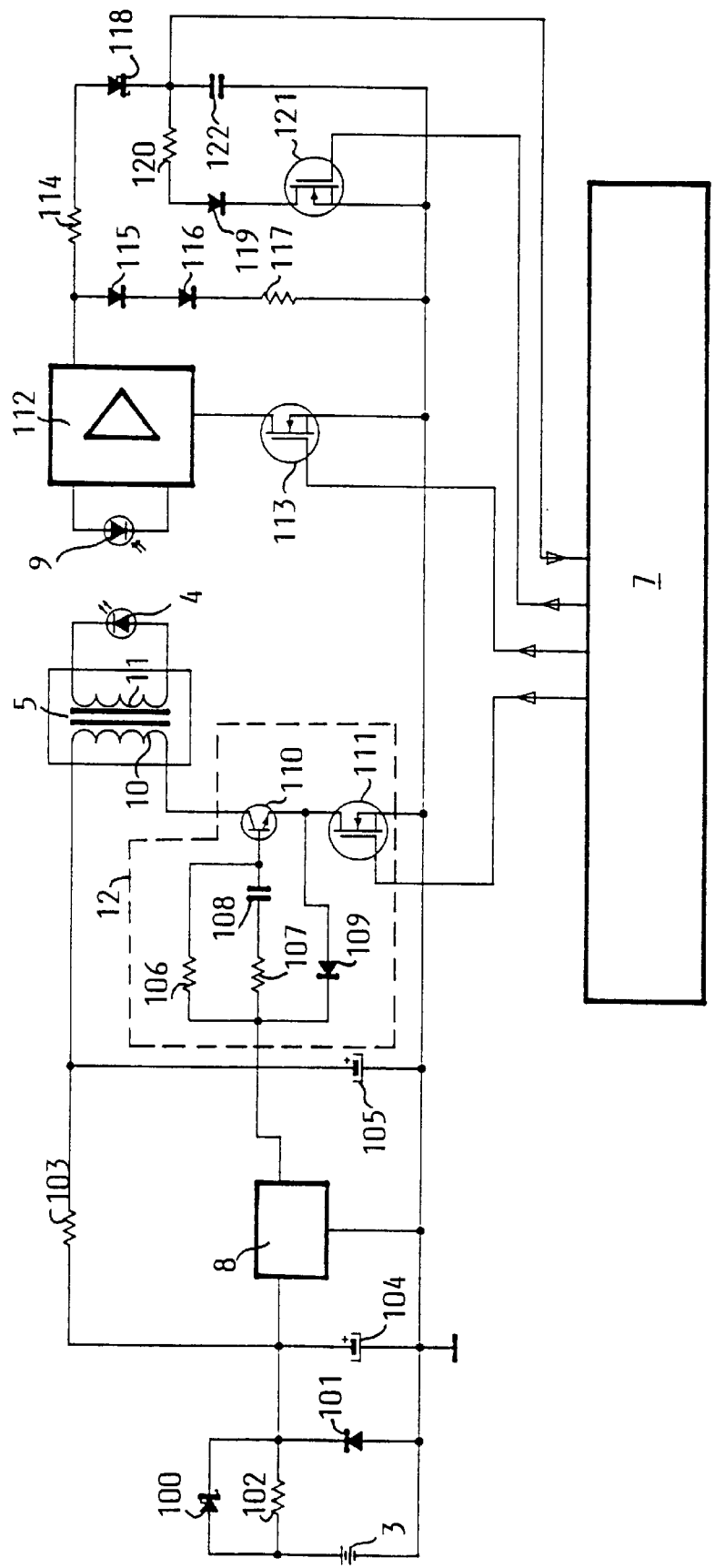
FIG. 4 is a schematic of the electronic circuitry of the invention.

FIG. 4 is a schematic of an electronic circuit in a particular embodiment of the invention. The following table identifies the values of the components identified in FIG. 4 by a reference numeral.

| REF. NO. | VALUE OR IDENTIFICATION OF COMPONENTS | REF. NO. | VALUE OR IDENTIFICATION OF COMPONENTS |
|---|---|---|---|
| 4 | infra red sender (LED) | 111 | mosfet BSP295 |
| 9 | infra red receiver (LED or transistor) | 112 | Amplifier |
| 100 | Schottky diode | 113 | mosfet BSP295 |
| 101 | diode (1N4001) | 114 | 12 kΩ |
| 102 | 100Ω | 115 | diode (1N4148) |
| 103 | 1 kΩ | 116 | diode (1N4148) |
| 104 | 4700 µF | 117 | 8.2 kΩ |
| 105 | 10 µF/16V | 118 | Schottky diode |
| 106 | 12 kΩ | 119 | diode (1N4148) |
| 107 | 1 kΩ | 120 | 1 kΩ |
| 108 | 100 nF | 121 | mosfet BSS138 |
| 109 | diode (1N4148) | 122 | 1 nF |
| 110 | transistor BUX 87 | — | — |

Since a circuit designer of ordinary skill in the art could build and use this circuit as a result of this information, a detailed description of the signal paths and functions of the various components need not be undertaken. Instead, certain features of this circuit will be highlighted in the discussion below.

Under control of timer means in microcontroller 7, switching means 12 is opened and closed for disconnecting and connecting primary coil 10 to battery 3 for a period of time, as explained hereinabove. Switching means 12 includes a cascode circuit having a transistor 110, resistors 106 and 107, a capacitor 108, a diode 109 and a mosfet 111, as illustrated in FIG. 4. Such a cascode circuit, which is also known as emitter switching, is known per se and allows switching of transistor 110 very quickly on and off, which is required to withstand high voltage peak values. Transistor 110 can withstand the high voltage peak values, which are caused by primary coil 10 when opening the switching means, while mosfet 111, due to the other elements of the cascode circuit, must only withstand a voltage of 5V supplied by a voltage regulator 8.

Starting from battery 3, the circuit includes resistor 102 and diodes 100 and 101 in such a configuration that, in case the battery is not inserted in the right position, the resulting inverse voltage is clamped to −0.7 Volts by diode 101, and the entire circuit is protected from reverse polarity.

Capacitors 104 and 105 are connected as buffer capacity to provide an actuation signal, for example for opening and closing a valve in the event the invention is used for an automatic faucet devices. Primary and secondary coils 10 and 11 are wound around the same ferrite core 5, as explained hereinabove.

When an electrical pulse is generated, as explained hereinabove, light emitting diode 4 emits an infra-red light beam into the target area. If an object is present in this target area, the presence of this object will be detected by means of a receiver 9 for receiving the emitted light beam. This can be done in different ways. According to a first embodiment, the emitted signal is reflected by the object back towards and received by receiver 9. In case the object to be detected is for example an object of a dark color such as dirty hands or a person wearing a dark suit, the reflected signal will have a substantially lower amplitude than the emitted signal. Especially in such a case, it is very important to have a good detection which can be achieved by the invention due to the fact that the transmitted signals are of a high amplitude without requiring more energy. According to a second embodiment, the signal emitted from the LED is transmitted towards receiver 9, either directly or through the intermediary of a reflector. The presence of an object is in this case detected when the emitted signal is interrupted by the object and does not reach the receiver any more or with a too low amplitude.

When receiver 9 receives an emitted light beam, it generates a signal which is amplified by amplifier 112, passes through resistor 114 and diode 118 and charges capacitor 122. Resistor 120, diode 119 and mosfet 121 are used to discharge capacitor 122, under control of microcontroller 7. Capacitor 122 can thus be considered as a memory, which is charged with a signal when an object is present in the target area. Under control of microcontroller 7, the content of capacitor 122 is read and the capacitor is discharged.

Resistor 117 is a pull-down load resistor for amplifier 112. Diodes 115 and 116 create a voltage offset to match the microcontroller voltage level requirements.

In order to save energy, mosfet 113 is used to enable amplifier 112 only when a light signal is emitted. In this respect, also the peripheral components of the invention are preferably in stand-by or sleepmode for about 70% of the time. When an object is detected in the target area, the device will return to the active state wherein the frequency of the emitted light pulses is increased in order to enable quick responses of the device and/or wherein the emitted light pulses will have a higher energy level, in particular by varying the closing time of switching means 12.

The invention may further include means for measuring the voltage of the battery such means are known per se, for example from BP-B-0 423 102. According to the invention, further means are provided, for example in the microcontroller, for determining the period of time required to accumulate the predetermined amount of magnetic energy on the basis of the measured voltage of the battery. Timer means may also be provided, for example in the microcontroller for closing the switching means each time for a period of time. These determining and timer means are used by the microcontroller to adjust the time for accumulating magnetic energy as a function of the measured voltage, so that the same amount of energy is always provided to the LED.

A further function of the voltage measurement is for generating buzzer signals to inform the user that the battery has lost a predetermined amount of voltage and that the battery has to be replaced, This is described in detail in EP-B-0 423 102, which is incorporated herein by reference.

In summary, the present invention relates to a low voltage proximity detecting device for detecting an object in a target area. This device provides electrical pulses having a relatively high energy level but of a short duration. This enables the device to require a reduced amount of energy to emit light pulses, but covering a similar or even greater target area than prior art devices, and it allows stronger light pulses to be emitted to obtain better detection. The device car be used not only as an automatic control system for bathroom fittings such as urinals or toilets, but also for automatic door opening systems. In the described embodiment, a battery has been used as a low voltage source. It is, however, clear that the use of other low voltage sources, such as photo cells, can also be used, especially if the energy source has to provide energy only for the detecting device as such, including the microprocessor.

I claim:

1. In a proximity detecting device for detecting the presence of an object in a target area, having a low voltage power source, circuitry for generating electrical pulses and supplying them to a light emitting diode (LED) in order to emit light pulses toward the target area, and for receiving the light pulses emitted from the LED and directed towards the target area, the improvement comprising in combination: a first circuit containing a primary coil and switching means for connecting the primary coil for a period of time to the low voltage power source to accumulate a predetermined amount of magnetic energy in said primary coil, and a second circuit containing the LED and a secondary coil magnetically coupled to said primary coil to transform the accumulated magnetic energy by mutual induction into one of the high electrical current pulses flowing through the LED upon deactuating said switching means to disconnect the low voltage power source from said primary coil, a receiver being adapted to receive the light pulses directly or in the alternative to receive the light pulses reflected from the object and a microprocessor for controlling the operation of the LED and said receiver.

2. The device according to claim 1, wherein the proportion of the number of windings of said primary coil to the number of windings of said secondary coil is at least equal to about 100.

3. The device according to claim 1, characterised in that the electrical pulses have a raising edge with a duration lower than 10 μsec.

4. The device according to claim 1, characterised in that said primary coil has a number of windings at least equal to about 300.

5. The device according to claim 1, characterised in that it comprises means for determining the voltage of the low voltage power source, means for determining the period of time required to accumulate the predetermined amount of magnetic energy on the basis of the voltage of the low voltage power source and timer means for closing said switching means each time for the determined period of time.

6. The device according to claim 1, characterised in that said switching means comprise a cascode circuit.

7. The device as set forth in claim 1, wherein the proportion of the number of windings of said primary coil to the number of windings of said secondary coil is at least equal to about 100.

8. The device as set forth in claim 1, wherein the electrical pulses have a rising edge with a duration lower than 10 μsec.

9. The device as set forth in claim 1, wherein said primary and secondary coils are wound over one another around a same core.

10. The device as set forth in claim 1, wherein said primary coil has a number of windings at least equal to about 300.

11. The device as set forth in claim 1, including means for determining the voltage of said low voltage power source, means for determining the period of time required to accumulate the predetermined amount of magnetic energy as a function of the voltage of said low voltage power source and timer means for closing said switching means each time for the period of time.

12. The device as set forth in claim 1, wherein said switching means comprise a cascode circuit.

13. The device according to claim 1, characterised in that said primary and secondary coils are wound over one another around a same core.

14. The device according to claim 4, characterised in that said core is a ferrite core.

15. A proximity detecting device for detecting the presence of an object in a target area, said device comprising in combination;
(a) a low voltage power source;
(b) a first circuit containing a primary coil and switching means for connecting said primary coil for a period of time to said low voltage power source to accumulate a predetermined amount of magnetic energy in said primary coil;
(c) a second circuit containing an LED and a secondary coil magnetically coupled to said primary coil to transform the accumulated magnetic energy by mutual induction upon opening said switching means each time into an electrical pulse for said LED.

16. The device as set forth in claim 13, wherein said core is a ferrite core.

17. A proximity detecting device for detecting the presence of an object or human body part within a target area, said device comprising in combination:
(a) a first circuit having a first coil for producing a magnetic field, said first circuit including a low voltage source and means for electrically connecting said first coil across said low voltage source to develop the magnetic field and for disconnecting said low voltage source from said first coil to collapse the magnetic field and to generate an electromotive force;
(b) a second circuit for producing a pulse in response to the electromotive force developed by said first circuit, said second circuit including a second coil magnetically coupled to said first coil for producing said pulse upon collapse of the magnetic field and means for emitting a further pulse into the target area in response to said pulse produced by said second coil; and
(c) a receiver for detecting the presence of said further pulse emitted from said emitting means into the target area.

18. The proximity detecting device as set forth in claim 17 wherein said receiver is responsive to said further pulse emitted from said emitting means and reflected by an object or human body part within the target area.

19. The proximity detecting device as set forth in claim 17 wherein said emitting means is a light emitting diode and wherein said further pulse is a light pulse.

20. The proximity detecting device as set forth in claim 17 including a microprocessor for controlling operation of the generation of said pulse and said further pulse and the detection of said further pulse.

21. The proximity detecting device as set forth in claim 17 wherein said pulse generated has a leading edge of no more than 10 μsec duration.

22. The proximity detecting device as set forth in claim 17 wherein said first coil includes about 300 windings.

23. The proximity detecting device as set forth in claim 17 wherein said connecting and disconnecting means comprises switching means and wherein said switching means comprises a cascode circuit.

24. The proximity detecting device as set forth in claim 17 wherein said receiver is responsive to said further pulse emitted directly from said emitting means in the absence of an object or human body part within the target area.

25. The proximity detecting device as set forth in claim 24 wherein said emitting means is a light emitting diode and wherein said further pulse is a light pulse.

26. The proximity detecting device as set forth in claim 17 wherein the ratio of windings of said first coil to said second coil is on the order of about 100.

27. The proximity detecting device as set forth in claim 21 wherein said first coil includes about 300 windings.

28. The proximity detecting device as set forth in claim 17 including a core and wherein said first and second coils are wound about said core.

29. The proximity detecting device as set forth in claim 28 wherein said core is a ferrite core.

30. The proximity detecting device as set forth in claim 17 wherein said emitting means is an infrared sender and wherein said receiver is an infrared receiver.

31. The proximity detecting device as set forth in claim 30 wherein said receiver is responsive to said further pulse emitted directly from said emitting means in the absence of an object or human body part within the target area.

32. The proximity detecting device as set forth in claim 31 wherein said emitting means is a light emitting diode and wherein said further pulse is a light pulse.

33. A proximity detecting device for detecting the presence of an object in a target area, said device comprising in combination:

(a) a low voltage power source;

(b) a circuit for generating electrical pulses and supplying them to a light emitting diode (LED) in order to emit light pulses into the target area;

(c) a receiver for receiving the light pulses emitted from said LED and directed towards the target area;

(d) a first circuit containing a primary coil and switching means for connecting said primary coil for a period of time to said low voltage power source to accumulate a predetermined amount of magnetic energy in said primary coil; and (e) a second circuit containing said LED and a secondary coil magnetically coupled to said primary coil to transform the accumulated magnetic energy into one of said electrical pulses each time upon opening said switching means.

34. An active proximity detecting device for detecting the presence of an object in a target area, said device comprising in combination:

(a) a low voltage power source;

(b) a first circuit having a primary coil and a switching means for connecting said primary coil to said low voltage power source to accumulate a predetermined amount of magnetic energy in said primary coil;

(c) a second circuit having a secondary coil magnetically coupled to said primary coil to transform the accumulated magnetic energy by mutual induction into a high electrical current pulse flowing through the LED (upon actuation of said switching means and an LED energized by the electrical pulse) to emit a light pulse upon opening said switching means to disconnect said primary coil from said low voltage power source;

(d) a receiver for receiving in the alternative the light pulse directly from said LED or the light pulse reflected from the object; and (e) a microprocessor coupled with said first and second circuits for controlling the operation of said LED and said receiver.

35. The device as set forth in claim 34, including a core for supporting said primary and secondary coils wound over one another.

36. The device as set forth in claim 34, wherein said microprocessor includes means for determining the switching rate of said switching means as a function of the voltage of said low voltage power source to control the magnetic energy accumulation of said primary coil.

37. The device as set forth in claim 34 wherein said microprocessor provides an indication of a voltage drop of said low voltage power source.

38. The device as set forth in claim 34, wherein the ratio of maximum current through said secondary coil for a first time period has a value of more than 100 times the maximum current through said primary coil for a second time period.

39. The device as set forth in claim 38, wherein the leading edge of the electrical pulse is less than 10 $\mu$sec.

40. A proximity detection device for detecting the presence of an object in a target area by generating a high amplitude short duration current pulse from a low voltage power source to energize an LED for emitting a light pulse, said device comprising:

(a) a transformer having a primary coil and a secondary coil;

(b) switching means for periodically connecting the low voltage power source with said primary coil for a first period of time to accumulate a predetermined amount of magnetic energy in said primary coil during the first period of time and for transforming the accumulated magnetic energy by mutual induction into a high amplitude current pulse in said secondary coil upon opening said switching means, said mutual induction having a duration of a second period of time which second period of time is less than the first period of time;

(c) conductor means for conducting the current pulse to the LED to energize the LED and emit a high energy short duration light pulse;

(d) a receiver for receiving the light pulse directly or in the alternative as a light pulse reflected from the object and for generating an output signal responsive to the received light pulse; and (e) a microprocessor responsive to the output signal for controlling operation of said switching means and said receiver.

41. The device as set forth in claim 40, wherein the ratio of the peak current through said primary coil to the peak current through the LED is more than about 1 to about 100.

42. The device as set forth in claim 40, wherein the ratio of the average current through said primary coil to the peak current through the LED is more than about 1 to about 200.

43. The device as set forth in claim 40, wherein the ratio of the average current through said primary coil to the peak current through the LED is about 1 to about 200.

* * * * *